United States Patent
Hwang et al.

(10) Patent No.: US 9,337,203 B2
(45) Date of Patent: May 10, 2016

(54) SEMICONDUCTOR DEVICE WITH LINE-TYPE AIR GAPS AND METHOD FOR FABRICATING THE SAME

(71) Applicant: SK hynix Inc., Gyeonggi-do (KR)

(72) Inventors: Chang-Youn Hwang, Gyeonggi-do (KR); Sang-Kil Kang, Gyeonggi-do (KR); Ill-Hee Joe, Gyeonggi-do (KR); Dae-Sik Park, Gyeonggi-do (KR); Hae-Jung Park, Gyeonggi-do (KR); Se-Han Kwon, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/506,393

(22) Filed: Oct. 3, 2014

(65) Prior Publication Data

US 2015/0255466 A1    Sep. 10, 2015

(30) Foreign Application Priority Data

Mar. 5, 2014  (KR) .................. 10-2014-0025949

(51) Int. Cl.

| H01L 21/285 | (2006.01) |
|---|---|
| H01L 21/311 | (2006.01) |
| H01L 21/336 | (2006.01) |
| H01L 27/108 | (2006.01) |
| H01L 21/02 | (2006.01) |
| H01L 21/768 | (2006.01) |

(52) U.S. Cl.
CPC ...... *H01L 27/10891* (2013.01); *H01L 21/0217* (2013.01); *H01L 21/02164* (2013.01); *H01L 21/28525* (2013.01); *H01L 21/31111* (2013.01); *H01L 21/7682* (2013.01); *H01L 21/76802* (2013.01); *H01L 21/76877* (2013.01); *H01L 21/76897* (2013.01); *H01L 27/10855* (2013.01); *H01L 27/10873* (2013.01); *H01L 27/10885* (2013.01); *H01L 27/10888* (2013.01); *H01L 27/10897* (2013.01)

(58) Field of Classification Search
CPC ............ H01L 21/76897; H01L 23/498; H01L 27/10855; H01L 27/10876; H01L 45/14
USPC .................................................. 438/381, 653
See application file for complete search history.

(56) References Cited

U.S. PATENT DOCUMENTS

| 8,344,517 | B2 | 1/2013 | Kim et al. | |
|---|---|---|---|---|
| 2012/0217631 | A1* | 8/2012 | Kim et al. | 257/734 |
| 2013/0020622 | A1 | 1/2013 | Saino | |
| 2013/0052780 | A1 | 2/2013 | Kim et al. | |
| 2013/0292847 | A1* | 11/2013 | Choi et al. | 257/774 |

FOREIGN PATENT DOCUMENTS

KR  1020150053020  5/2015

* cited by examiner

*Primary Examiner* — Evan Pert
*Assistant Examiner* — Changhyun Yi
(74) *Attorney, Agent, or Firm* — IP & T Group LLP

(57) ABSTRACT

A method includes: forming a first contact hole by etching a first inter-layer dielectric layer; forming a preliminary first conductive plug that fills the first contact hole; forming a bit line structure over the preliminary first conductive plug; forming a first conductive plug by etching the preliminary first conductive plug so that a gap is formed between a sidewall of the first contact hole and the first conductive plug; forming an insulating plug in the gap; forming a multi-layer spacer including a sacrificial spacer; forming a second conductive plug neighboring the bit line structures and the first conductive plugs with the multi-layer spacer and the insulating plug therebetween; and forming a line-type air gap within the multi-layer spacer by removing the sacrificial spacer.

16 Claims, 23 Drawing Sheets

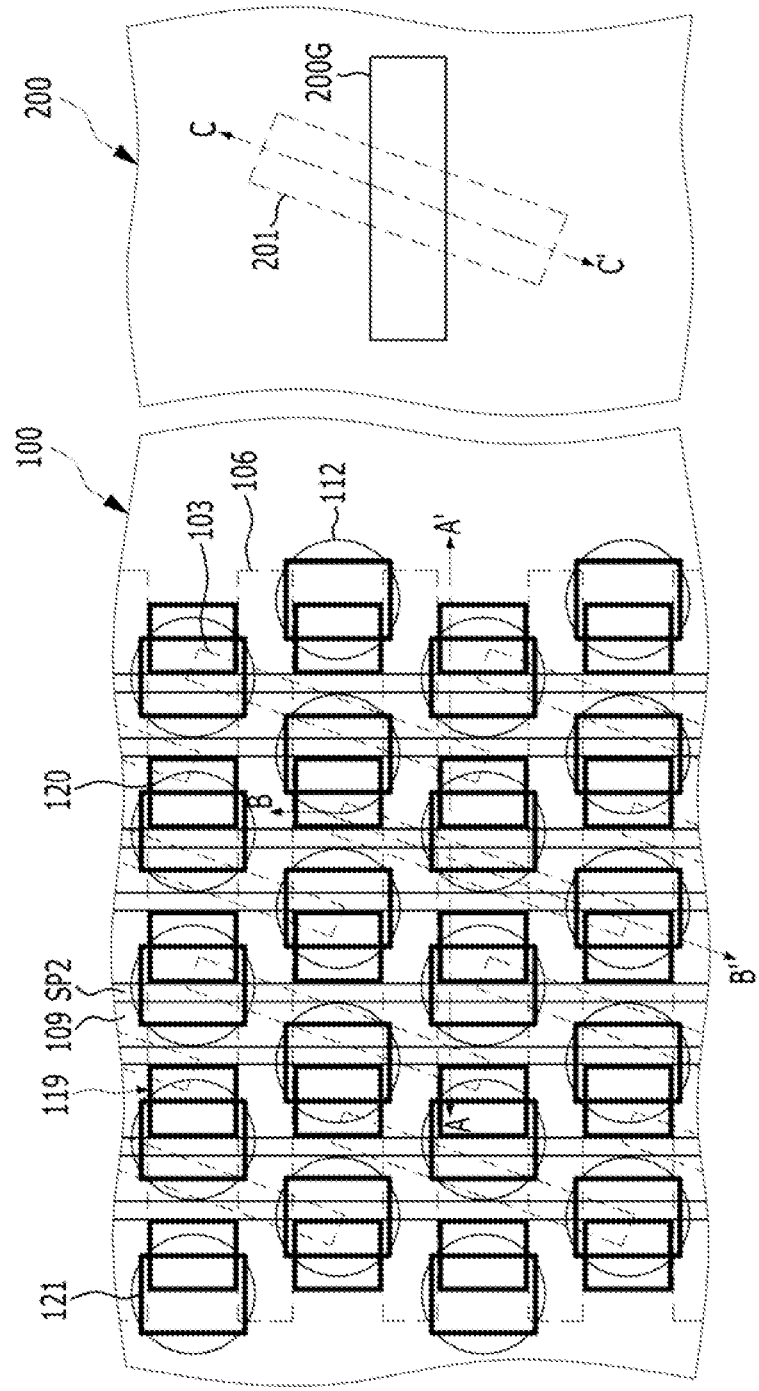

SEMICONDUCTOR DEVICE WITH LINE-TYPE AIR GAPS AND METHOD FOR FABRICATING THE SAME

CROSS-REFERENCE TO RELATED APPLICATIONS

The present application claims priority of Korean Patent Application No. 10-2014-0025949, filed on Mar. 5, 2014, which is herein incorporated by reference in its entirety.

BACKGROUND

1. Field

Exemplary embodiments relate to a semiconductor device and, more particularly, to a semiconductor device including line-type air gaps and a method for fabricating the semiconductor device.

2. Description of the Related Art

Semiconductor devices generally include dielectric material between conductive structures. As semiconductor devices become more highly integrated, the distance between conductive structures is becoming narrower, which leads to increased parasitic capacitance. The increased parasitic capacitance deteriorates the performance of semiconductor devices.

The parasitic capacitance may be decreased by lowering the dielectric constant of the dielectric material. However, with dielectric material having a high dielectric constant, there is a limit to how much the parasitic capacitance may be decreased.

SUMMARY

An embodiment is directed to a semiconductor device capable of decreasing parasitic capacitance between conductive structures, and a method for fabricating the semiconductor device.

In accordance with an embodiment, a method for fabricating a semiconductor device includes: forming a first inter-layer dielectric layer over a substrate; forming a first contact hole by etching the first inter-layer dielectric layer; forming a preliminary first conductive plug that fills the first contact hole; forming a bit line structure including a bit line over the preliminary first conductive plug; forming a first conductive plug by etching the preliminary first conductive plug so that a gap is formed between a sidewall of the first contact hole and the first conductive plug; forming an insulating plug in the gap; forming a multi-layer spacer including a sacrificial spacer and extending from over an upper portion of the insulating plug to over a sidewall of the bit line structure; forming a second conductive plug neighboring the bit line structures and the first conductive plugs with the multi-layer spacer and the insulating plug therebetween; and forming a line-type air gap within the multi-layer spacer by removing the sacrificial spacer.

In accordance with another embodiment, a semiconductor device includes: an inter-layer dielectric layer including contact hole over a substrate; a first conductive plug disposed in the contact hole; a bit line structure including a bit line and formed over the first conductive plug; a second conductive plug formed over a sidewall of the first conductive plug and further extending over a sidewall of the bit line structure; an insulating plug provided between the first conductive plug and the second conductive plug; a line-type air gap disposed between the bit line structure and the second conductive plug; a third conductive plug formed over the second conductive plug while capping a portion of the line-type air gap; and a capping layer formed over the third conductive plug while capping the other portion of the line-type air gap. The semiconductor device may further include: a protective spacer formed between the first conductive plug and the insulating plug and extending over the sidewall of the bit line structure. The protective spacer may include silicon nitride; and wherein the insulating plug may include silicon nitride. The semiconductor device may further include: a protective spacer formed between the first conductive plug and the insulating plug and extending over the sidewall of the bit line structure; a first spacer formed over an upper portion of the insulating plug and extending over a sidewall of the protective spacer; and a second spacer formed over a sidewall of the first spacer, wherein the line-type air gap is disposed between the first spacer and the second spacer, and wherein the first spacer and the second spacer collectively enclose the line-type air gap. The protective spacer, the first spacer, and the second spacer respectively may include silicon nitride. The first conductive plug and the second conductive plug may include polysilicon, and wherein the third conductive plug may include metal material. The first conductive plug and the bit line have the same line width. The semiconductor device may further include: an plug isolation layer formed between the bit line structure and a neighboring bit line structure, and further isolating the second conductive plug from a neighboring second conductive plug. The semiconductor device may further include: a buried gate-type transistor, including a buried word line, that is buried in the substrate; and a memory element coupled with the third conductive plug. The substrate may include a memory cell region and a peripheral circuit region, and the first conductive plug, the bit line structure, the second conductive plug, and the third conductive plug are formed in the memory cell region. The semiconductor device may further include: a non-buried-gate-type transistor formed over the substrate of the peripheral circuit region.

BRIEF DESCRIPTION OF THE DRAWINGS

FIG. 1A is a plan view illustrating a semiconductor device in accordance with an embodiment.

DETAILED DESCRIPTION

Figure 1B:
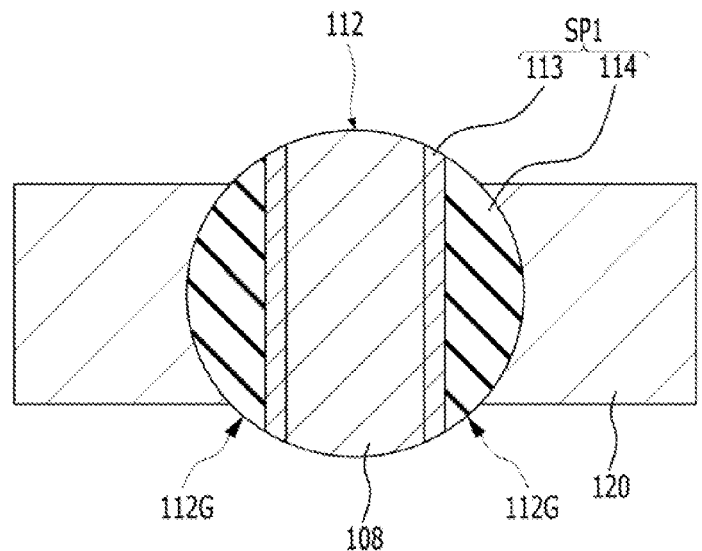
FIG. 1B illustrates a first spacer structure in detail.

Exemplary embodiments will be described below in more detail with reference to the accompanying drawings. The embodiments may, however, be modified in different forms and should not be construed as restrictive. Like reference numerals refer to like parts throughout the various figures and embodiments.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1C:
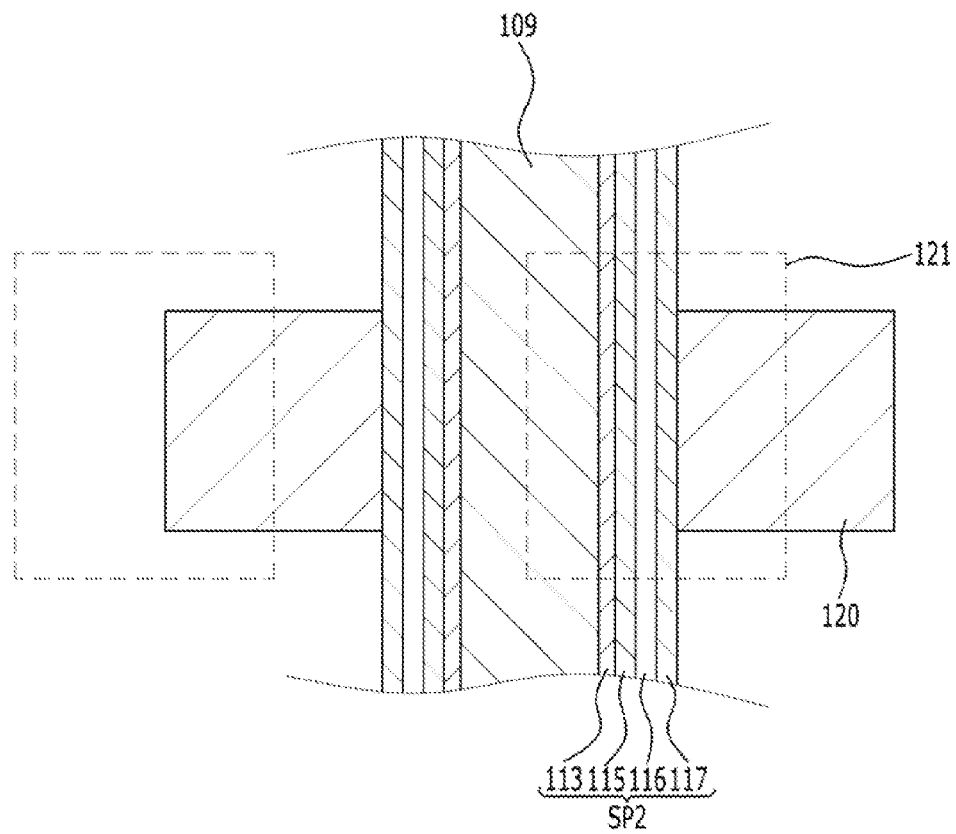
FIG. 1C illustrates a second spacer structure in detail.

FIG. 1A is a plan view illustrating a semiconductor device in accordance with an embodiment. FIG. 1B illustrates a first spacer structure in detail, and FIG. 1C illustrates a second spacer structure in detail.

Figure 2A:
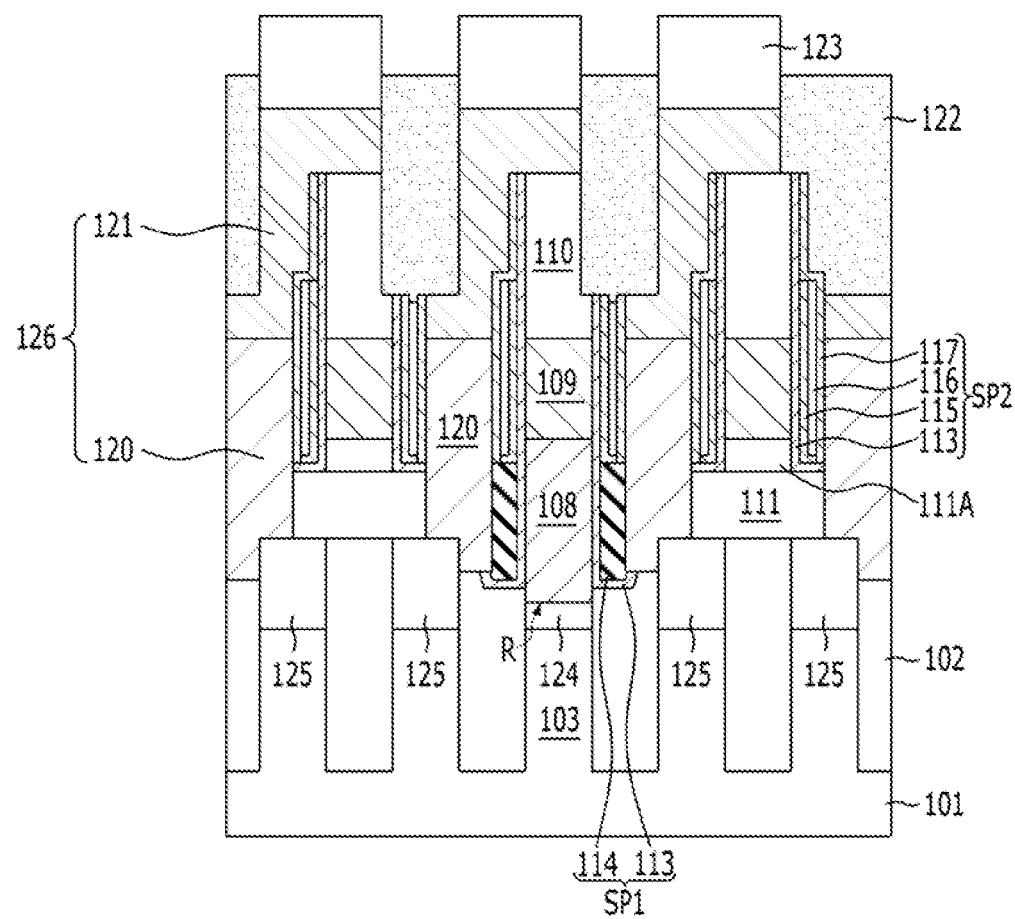
FIG. 2A is a cross-sectional view of the semiconductor device taken along an A-A' line shown in FIG. 1A.
Figure 2B:
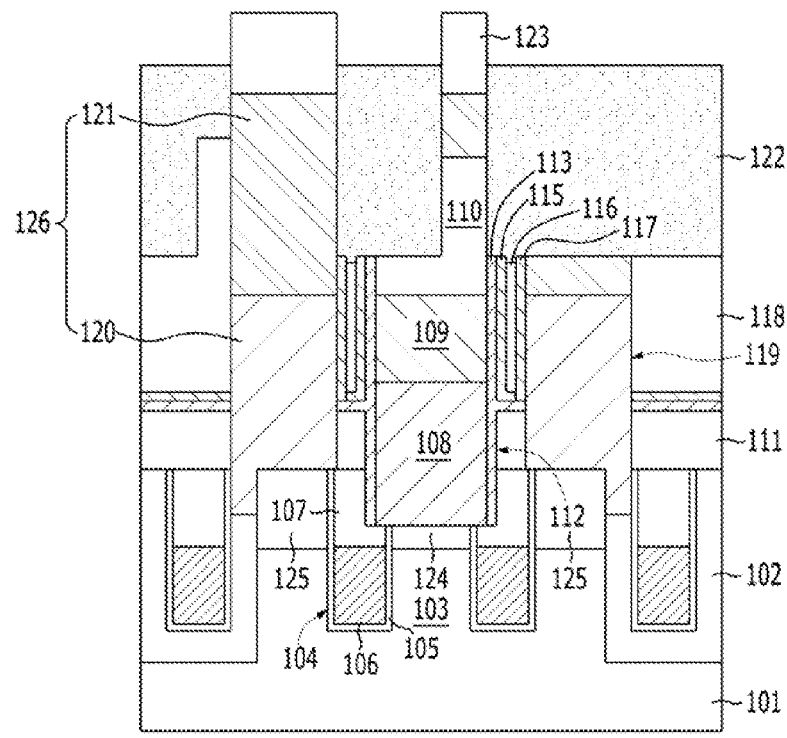
FIG. 2B is a cross-sectional view of the semiconductor device taken along a B-B' line shown in FIG. 1A.
Figure 2C:
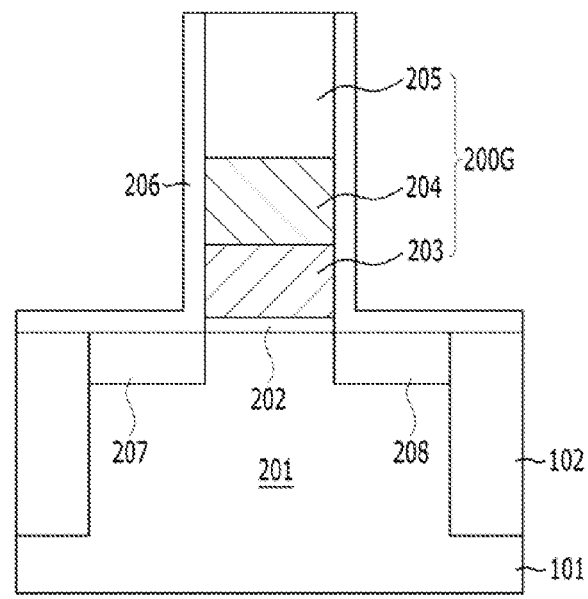
FIG. 2C is a cross-sectional view of the semiconductor device taken along a C-C' line shown in FIG. 1A.

FIG. 2A is a cross-sectional view of the semiconductor device taken along an A-A' line shown in FIG. 1A. FIG. 2B is a cross-sectional view of the semiconductor device taken along a B-B' line shown in FIG. 1A. FIG. 2C is a cross-sectional view of the semiconductor device taken along a C-C' line shown in FIG. 1A.

Referring to FIGS. 1A to 1C and FIGS. 2A to 2C, a substrate 101 includes a memory cell region 100 and a peripheral circuit region 200. An isolation layer 102 is formed in the substrate 101. The isolation layer 102 defines active regions 103. Gate trenches 104 are formed in the substrate 101 of the memory cell region 100. The gate trenches 104 are formed to extend across the active regions 103 and the isolation layer 102. A gate insulation layer 105 is formed on the surface of the gate trenches 104. Buried word lines 106 are formed over the gate insulation layer 105 to fill a portion of each gate trench 104. A first impurity region 124 and a second impurity region 125 are formed in the active region 103. The first impurity region 124 and the second impurity region 125 may be called a source region and a drain region. As a result, a buried gate type transistor including the buried word line 106, the first impurity region 124 and the second impurity region 125 is formed in the memory cell region 100. A sealing layer 107 is formed over the buried word lines 106. Bit line structures including bit lines 109 extend in a direction crossing the buried word lines 106.

The bit line structures include the bit lines 109 and a bit line hard mask 110. The bit lines 109 are coupled with a portion of each of the active regions 103 through first conductive plugs 108. The first conductive plugs 108 are coupled with the first impurity region 124. The first impurity region 124 have a recessed surface R, and the first conductive plugs 108 are formed on the recessed surface R. The first conductive plugs 108 may be silicon plugs including polysilicon. The first conductive plugs 108 are formed inside of first contact holes 112 which are formed in a first inter-layer dielectric layer 111. The line width of the first conductive plugs 108 is narrower than the diameter of the first contact holes 112. This leaves a gap 112G between the sidewall of each first contact hole 112 and each first conductive plug 108, The gap 112G is filled with a first spacer structure SP1.

The first spacer structure SP1 includes a protective spacer 113 and an insulating plug 114. The protective spacer 113 is formed on the sidewalls of each first conductive plug 108, and the insulating plugs 114 fill the gap 112G. The insulating plugs 114 are disposed between the first conductive plugs 108 and second conductive plugs 120. As described above, the protective spacers 113 and the insulating plugs 114 do not entirely surround the sidewalls of the first contact holes 112, but they are formed in the shape of pillars disposed between the first conductive plugs 108 and the second conductive plugs 120. The protective spacers 113 may extend over the sidewalls of the bit lines 109. The protective spacers 113 protect the bit lines 109 and the first conductive plugs 108. The protective spacers 113 and the insulating plugs 114 may each include silicon nitride. Also, second spacer structures SP2 including line-type air gaps 116 are formed on the sidewalls of the bit line structures. The second spacer structures SP2 include the protective spacers 13 first spacers 115, and second spacers 117. The first spacers 115 extend up to a lower level than the upper surfaces of the bit line structures. The line-type air gaps 116 are disposed between the first spacers 115 and the second spacers 117. The line-type air gaps 116 are extended to be parallel to the sidewalls of the bit lines 109. The second spacers 117 and the first spacers 115, in combination, seal the line-type air gaps 116. The line-type air gaps 116 may extend up to the same level as the upper surface of the first spacers 115. The protective spacers 113, the first spacers 115, and the second spacers 117 may each include silicon nitride.

Storage node contact plugs 126 may be coupled with the second impurity region 125. The storage node contact plugs 126 may be formed inside of second contact holes 119 formed in a second inter-layer dielectric layer 118. The second inter-layer dielectric layer 118 is formed between the bit line structures and between the storage node contact plugs 126. The second inter-layer dielectric layer 118 may serve as an plug isolation layer for isolating neighboring storage node contact plugs 126 from each other. The storage node contact plugs 126 include second conductive plugs 120 and third conductive plugs 121 that are formed over the second conductive plugs 120. The second conductive plugs 120 may include silicon plugs. The silicon plugs may include, for example, polysilicon. The third conductive plugs 121 are metal plugs including tungsten (W). A portion of each third conductive plug 121 overlaps with a predetermined area of the upper portion of each bit line structure.

A capping layer 122 is formed over the third conductive plugs 121. The capping layer 122 caps (i.e., extends over) the line-type air gaps 116.

As described above, the line-type air gaps 116 are formed between the bit line structures and the storage node contact plugs 126. The One-type air gaps 116 are formed on the sidewalk of the bit lines 109. The One-type air gaps 116 are capped by the capping layer 122 and the third conductive plugs 121. A portion of each line-type air gap 116 is capped by one third conductive plug 121, and the other portion of the line-type air gap 116 is capped by the capping layer 122.

Memory elements 123 electrically connected to the third conductive plugs 121 may be formed over the third conductive plugs 121, respectively. The memory elements 123 may be formed in various shapes.

The memory elements 123 may be capacitors. Therefore, the memory elements 123 may include storage nodes that contact the third conductive plugs 121. The storage nodes may have cylinder or pillar shapes. A capacitor dielectric layer may be formed on the surface of the storage nodes. The capacitor dielectric layer may include, for example, a zirconium oxide, an aluminum oxide, a hafnium oxide, or a combination thereof. For example, the capacitor dielectric layer may have a ZAZ structure where a first zirconium oxide, an aluminum oxide, and a second zirconium oxide are stacked. Plate nodes are formed over the capacitor dielectric layer. The storage nodes and the plate nodes each may include metal-containing material.

The memory elements 123 may include a variable resistor, which may include a phase-change material. According to an embodiment, the variable resistor may include transition metal oxide. According to another embodiment, the variable resistor may include a magnetic tunnel junction (MTJ).

Referring to FIGS. 1A and 2C, a transistor including a planar gate structure 200G is formed over an active region 201 of the peripheral circuit region 200. The planar gate structure 200G includes a first electrode 203, a second electrode 204, and a gate hard mask 205. The first electrode 203 may be formed of the same material as that of the first conductive plugs 108. The second electrode 204 may be formed of the same material as that of the bit lines 109. Gate spacers 206 are formed on the sidewalls of the planar gate structure 200. A source region 207 and a drain region 208 are formed in the active region 201. A gate insulation layer 202 is formed between the planar gate structure 200 and the active region 201.

As described above, the semiconductor device includes the buried word lines 106 the bit lines 109, the storage node contact plugs 126, and the memory elements 123. The second conductive plugs 120 of the storage node contact plugs 126 are spaced apart from the sidewalls of the bit lines 109 by the line-type air gaps 116. Therefore, the parasitic capacitance between the bit lines 109 and the storage node contact plugs 126 is decreased.

Hereafter, a method for fabricating the semiconductor device shown in FIG. 1 is described.

Figure 3A:
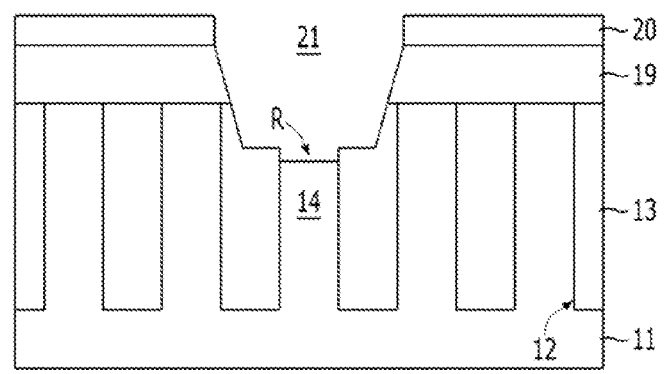
FIGS. 3A to 3Q describe a method for fabricating the semiconductor device shown in FIG. 1A and cross-sectional views of the semiconductor device taken along the A-A' line.
Figure 3B:
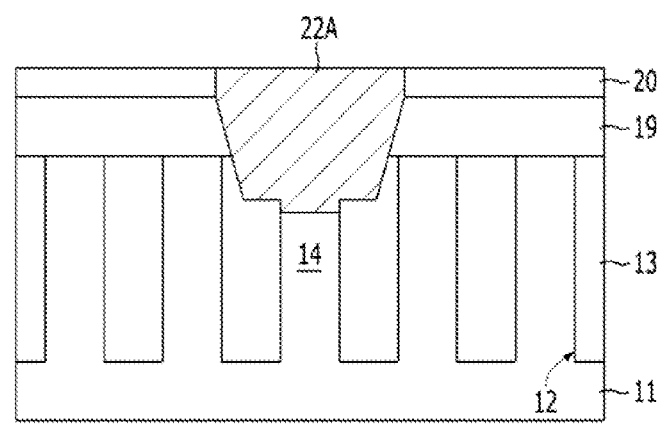
Figure 3C:
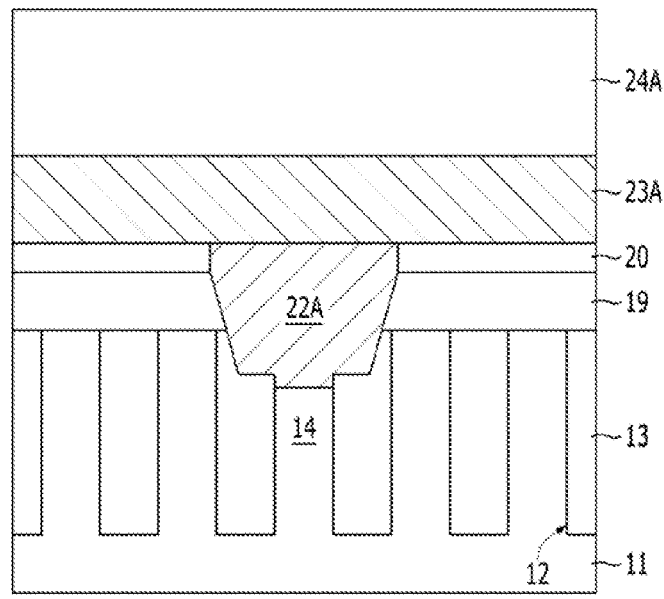
Figure 3D:
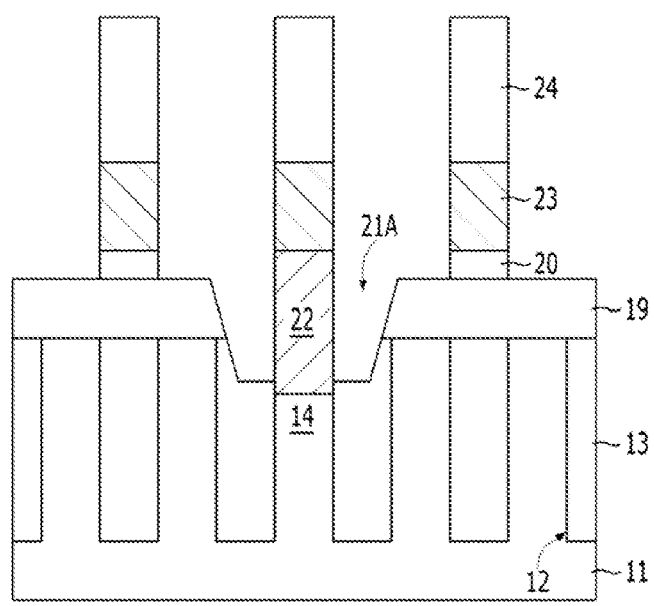
Figure 3E:
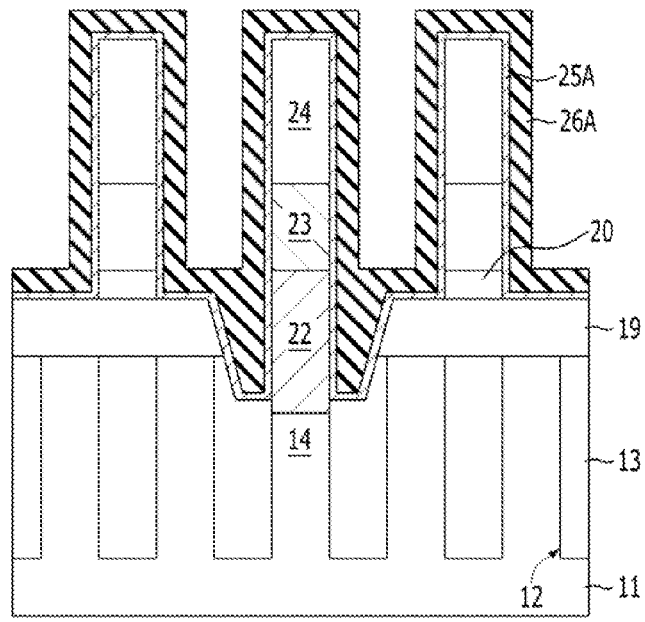
Figure 3F:
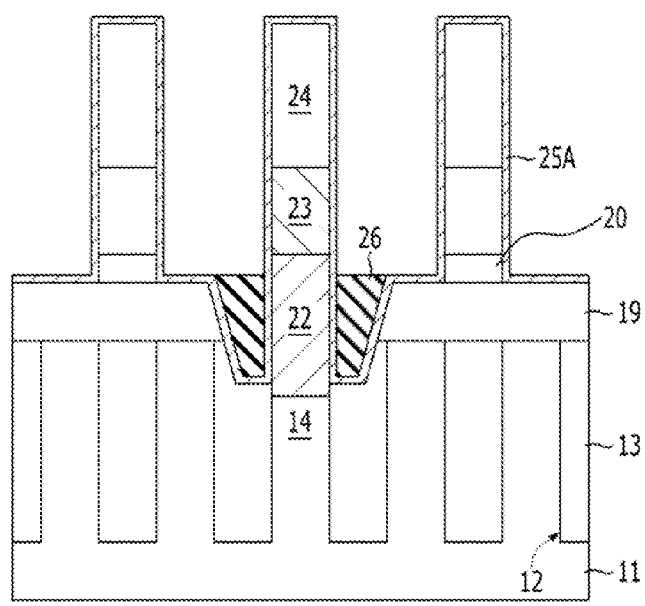
Figure 3G:
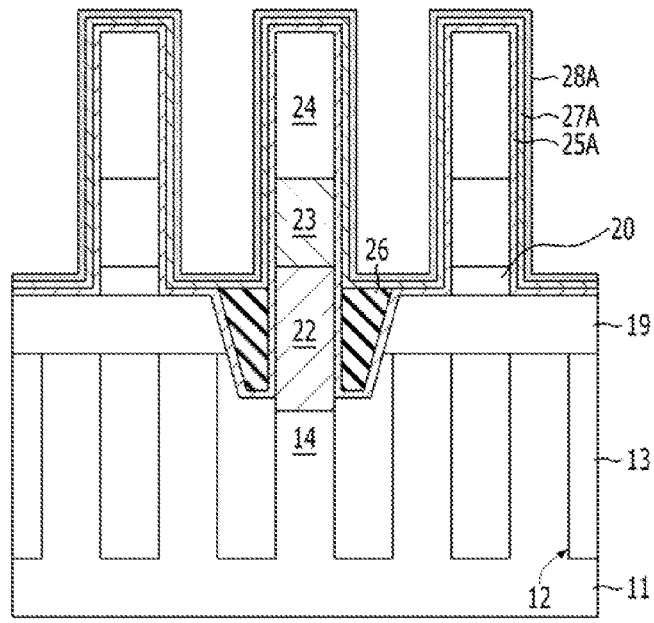
Figure 3H:
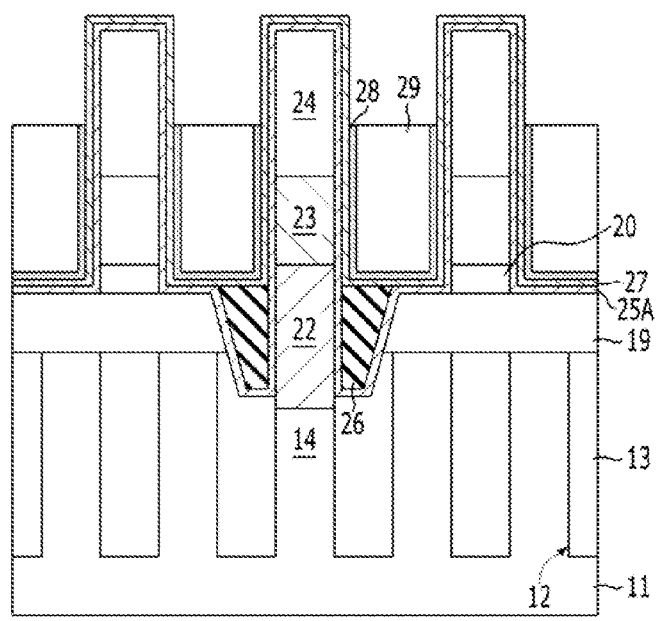
Figure 3I:
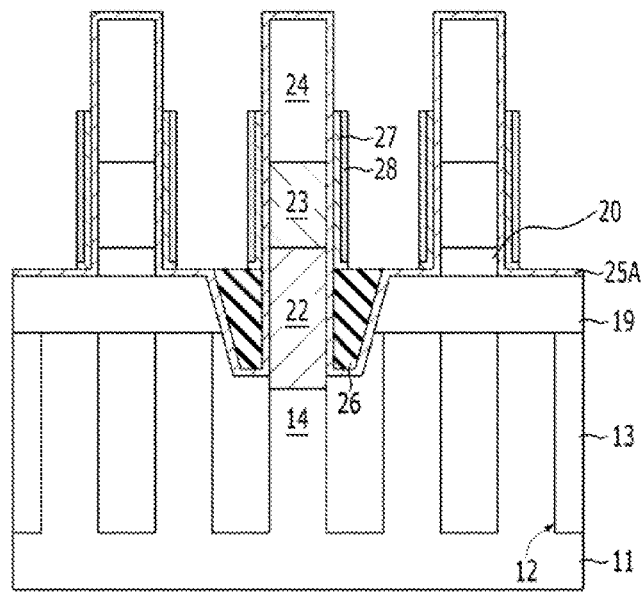
Figure 3J:
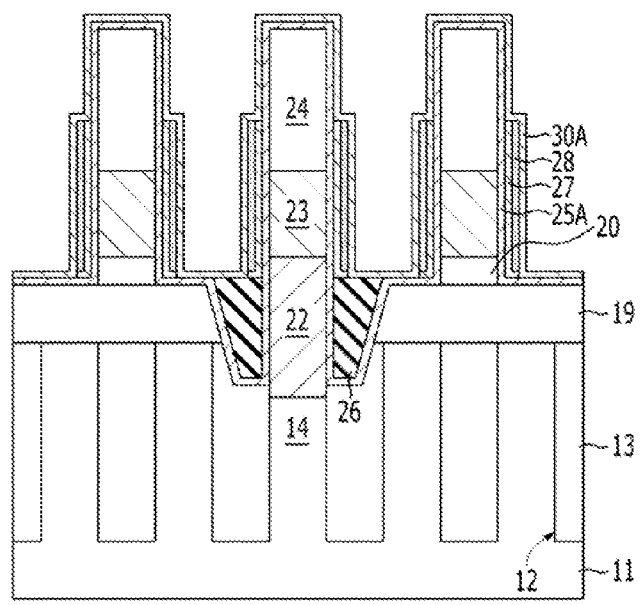
Figure 3K:
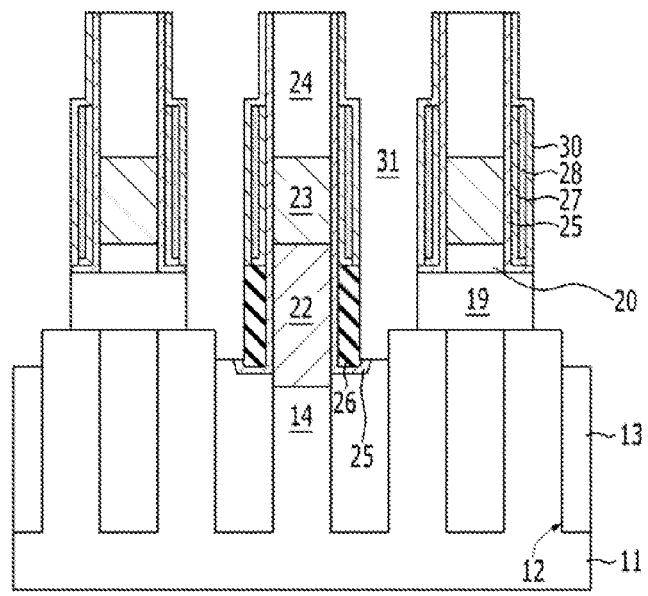
Figure 3L:
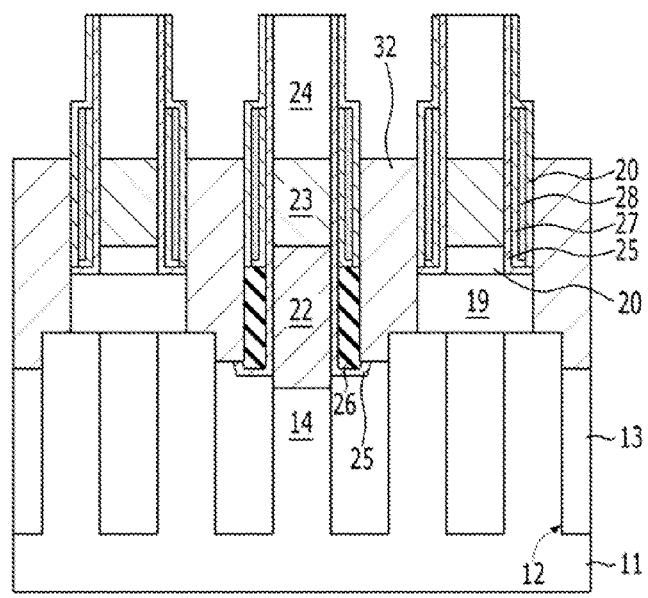
Figure 3M:
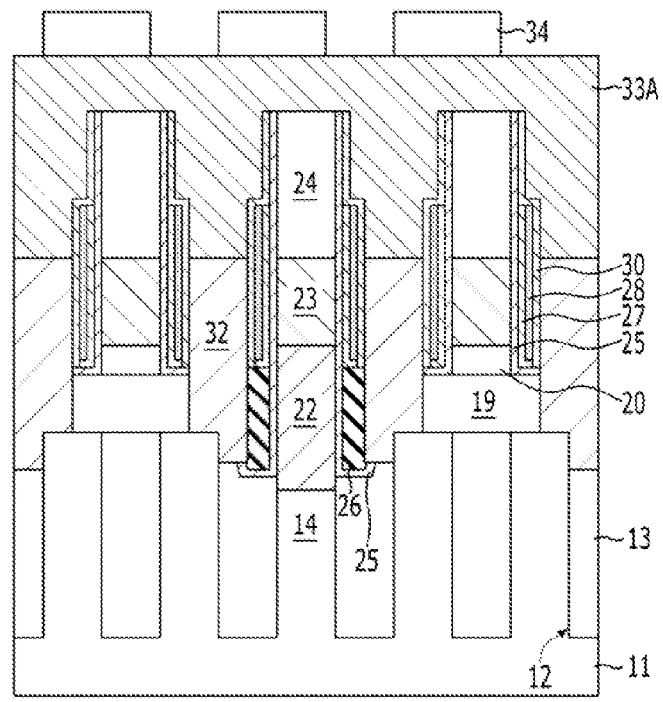
Figure 3N:
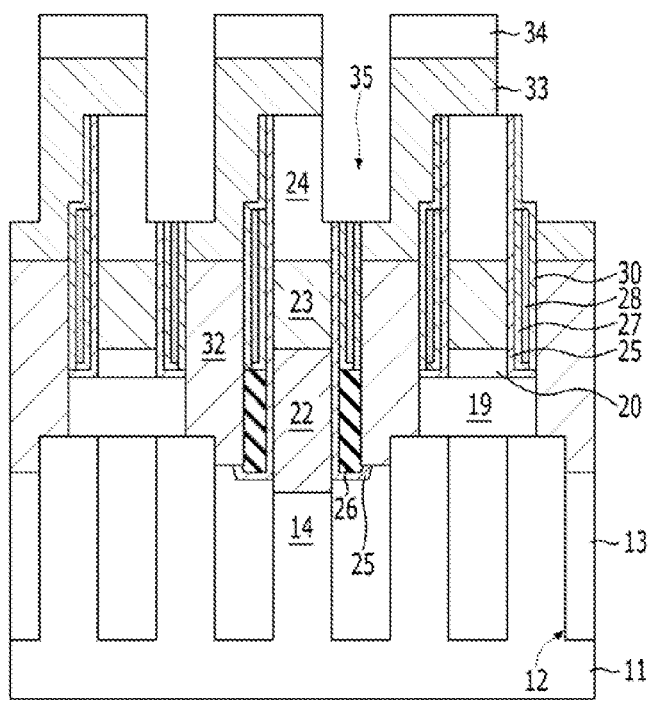
Figure 3O:
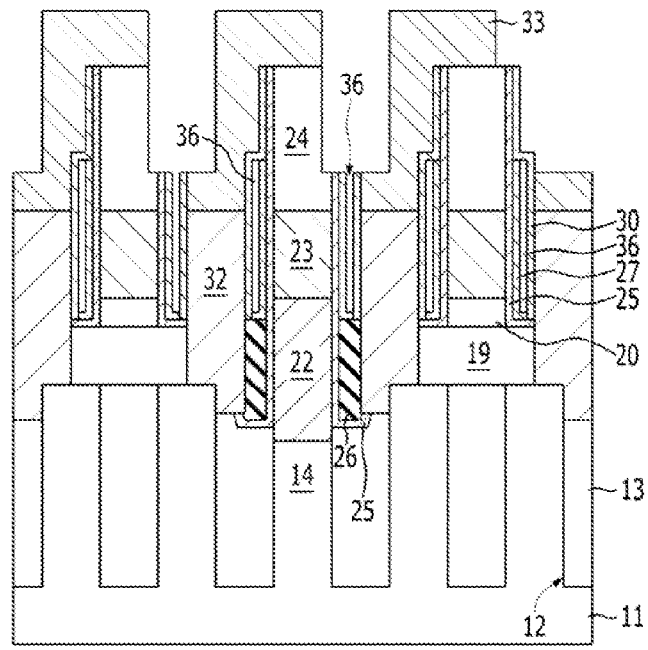
Figure 3P:
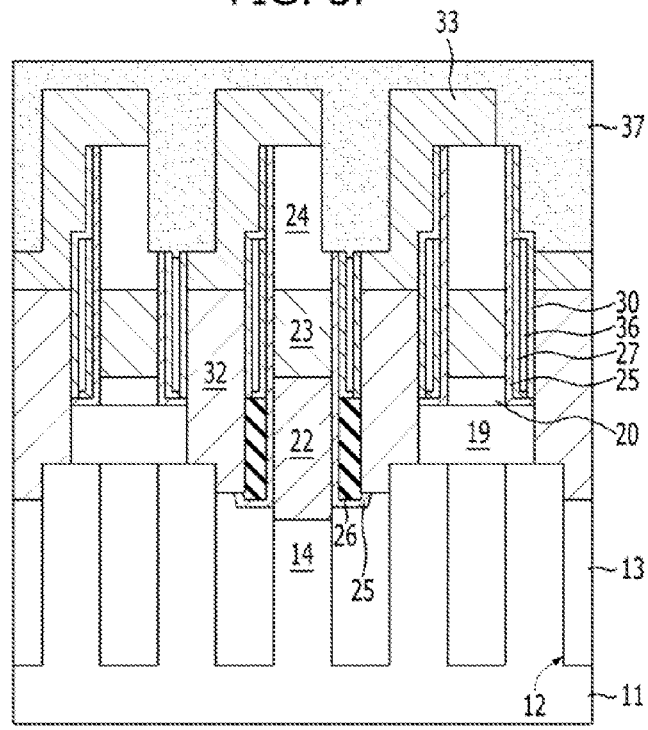
Figure 3Q:
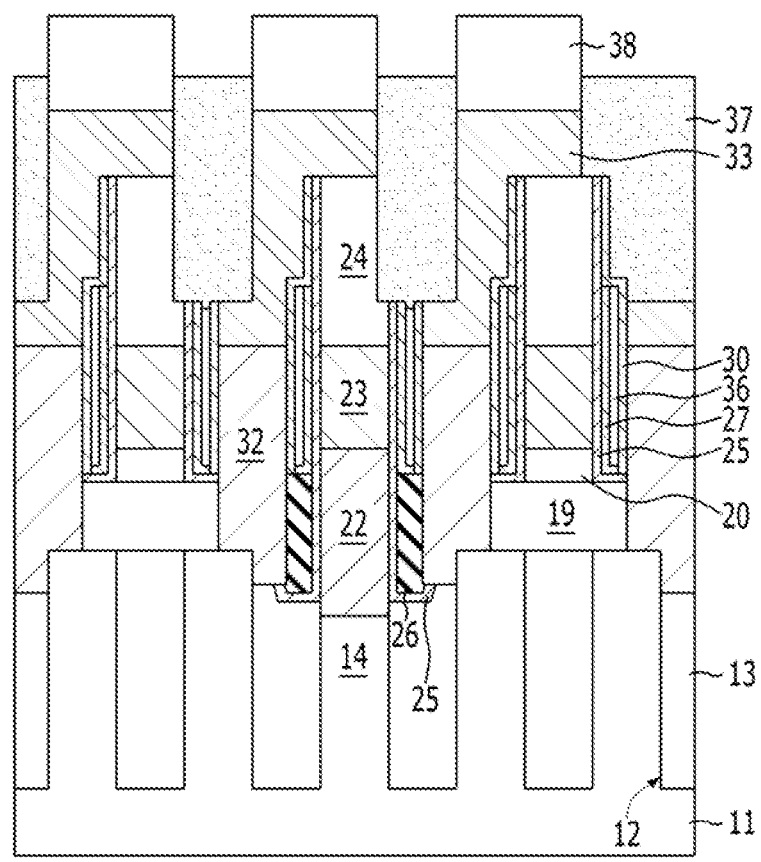
Figure 4A:
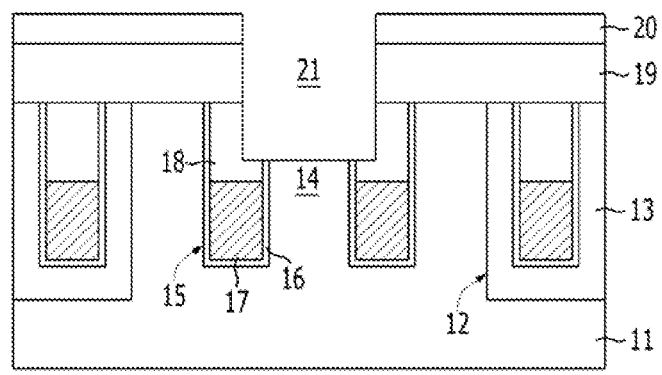
FIGS. 4A to 4Q describe a method for fabricating the semiconductor device shown in FIG. 1A and cross-sectional views of the semiconductor device taken along the B-B' line.

FIGS. 3A to 3Q describe a method for fabricating the semiconductor device shown in FIG. 1A. FIGS. 3A to 3Q show cross-sectional views of the semiconductor device taken along the A-A' line. FIGS. 4A to 4Q describe a method for fabricating the semiconductor device shown in FIG. 1A. FIGS. 4A to 4Q show cross-sectional views of the semiconductor device taken along the B-B' line.

Referring to FIGS. 3A and 4A, an isolation layer 13 is formed in a substrate 11. The substrate 11 may include a silicon substrate, a silicon germanium substrate or a Silicon-On-Insulator (SOI) substrate, etc. The substrate 11 may include a memory cell region and a peripheral circuit region. The isolation layer 13 may be formed through a Shallow Trench Isolation (STI) process. The isolation layer 13 is formed in isolation trenches 12. The isolation layer 13 defines active regions 14. The active regions 14 may have a shape of islands each having a long axis and a short axis. The isolation layer 13 isolates a plurality of the active regions 14. The isolation layer 13 may include silicon nitride or silicon oxide.

Transistors including buried word lines 17 are formed in the memory cell region. The buried word lines 17 are buried in the substrate 11. The buried word lines 17 are formed inside of gate trenches 15. The gate trenches 15 are formed to have a predetermined depth in the substrate 11. The depth of the gate trenches 15 may be shallower than the depth of the isolation trenches 12. The gate trenches 15 may have a line shape extending in one direction. The gate trenches 15 may be formed by etching the active regions 14 and the isolation layer 13. The gate trenches 15 may extend across the active regions 14 and the isolation layer 13. Thus, some of the gate trenches 15 are formed in the active regions 14, while the other gate trenches 15 are formed in the isolation layer 13. The depth of the gate trenches 15 is shallower than the depth of the isolation trenches 12.

A gate insulation layer 16 may be formed on the surface of the gate trenches 15. The gate insulation layer 16 may be formed through thermal oxidation. According to another embodiment, the gate insulation layer 16 may be formed through a Chemical Vapor Deposition (CVD) process or an Atomic Layer Deposition (ALD) process. The gate insulation layer 16 may include, for example, a high k dielectric material, an oxide, a nitride, an oxynitride, or a combination thereof. The high k dielectric material may be insulating material having a high dielectric constant compared with the dielectric constant of oxide and nitride. For example, the high k dielectric material may include metal oxides, such as a hafnium oxide and an aluminum oxide.

The buried word lines 17 are formed over the gate insulation layer 16. A sealing layer 18 is formed over the buried word lines 17. The buried word lines 17 may be formed by forming a metal-containing layer to gap-fill the gate trenches 15 and then performing an etch-back process. The metal-containing layer may include a material containing a metal such as titanium, tantalum, or tungsten as a major component. For example, the metal-containing layer may include tantalum nitride (TaN), a titanium nitride (TIN), a tungsten nitride (WN), tungsten (W), or a combination thereof. For example, the buried word lines 17 may be formed in a two-layer structure such as TiN/W where tungsten (W) is stacked over a titanium nitride (TiN). According to another embodiment, the buried word lines 17 may include a work function metal layer. The sealing layer 18 fills the gate trenches 15 and is formed over the buried word lines 17. The sealing layer 18 protects the buried word lines 17 from the subsequent processes. The sealing layer 18 may include a dielectric material. The sealing layer 18 may include silicon nitride. After the sealing layer 18 is formed, a first impurity region and a second impurity region (refer to reference numerals '124' and '125' of FIGS. 2A and 2B.) may be formed in the active regions 14. As a result, buried gate-type transistors including the buried word lines 17 are formed in the memory cell region.

A first inter-layer dielectric layer 19 is formed over the substrate 11. An etch stop layer 20 is formed over the first inter-layer dielectric layer 19. The first inter-layer dielectric layer 19 may include silicon oxide. The first inter-layer dielectric layer 19 may include silicon nitride.

First openings 21 are formed. The first openings 21 are formed by etching the etch stop layer 20 and the first inter-layer dielectric layer 19. The first openings 21 partially expose the active regions 14. The first openings 21 may partially expose the active regions 14 between the buried word lines 17. The first openings 21 are contact holes in which first conductive plugs are to be formed. The width of the first openings 21 may be wider than the width of the short axis of the active regions 14. Therefore, a portion of the isolation layer 13 and a portion of the sealing layer 18 may be etched in the process of etching the first openings 21. The first openings 21 expose a portion of the active regions 14.

The active regions 14 exposed through the first openings 21 are recessed (refer to a reference sign 'R'). As a result, the surface of the active regions 14 exposed through the first openings 21 becomes lower than the surface of the active regions 14 where the first openings 21 are not formed. The recess process improves the contact resistance between the active regions 14 and the first conductive plugs.

Figure 4B:
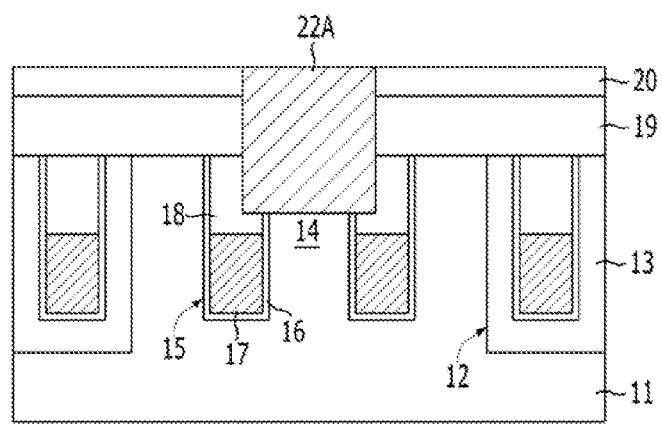

Referring to FIGS. 3B and 4B, preliminary first conductive plugs 22A are formed. The preliminary first conductive plugs 22A may be formed in the following method. To begin, a first conductive layer (not shown) filling the first opening 21 is formed over the substrate structure including the first openings 21. Subsequently, the first conductive layer (not shown) is planarized in such manner that the surface of the etch stop layer 20 is exposed. As a result, the preliminary first conductive plugs 22A are formed in the memory cell region. The surface of the preliminary first conductive plugs 22A and the surface of the etch stop layer 20 may level off. Subsequently, the preliminary first conductive plugs 22A may be doped with an impurity through a doping process such as an implantation process. The preliminary first conductive plugs 22A may include a polysilicon layer.

Figure 4C:
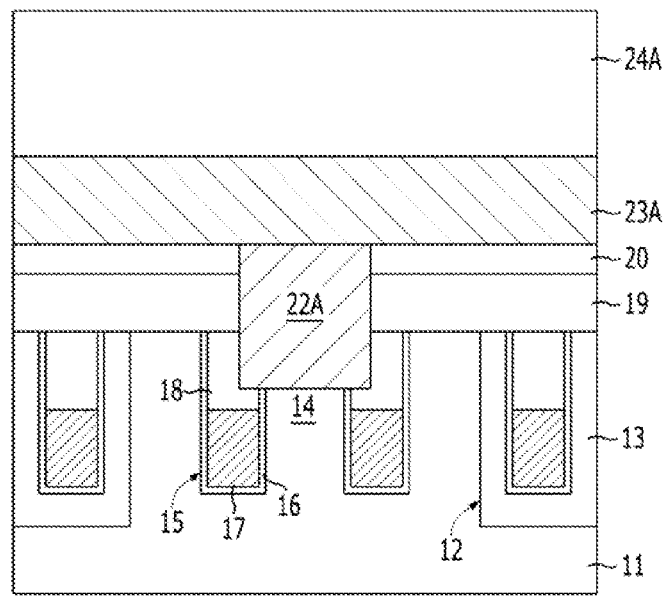

Referring to FIGS. 3C and 4C, a second conductive layer 23A and a hard mask layer 24A are stacked over the preliminary first conductive plugs 22A. The second conductive layer 23A includes a metal-containing layer. The hard mask layer 24A includes an insulating material.

Figure 4D:
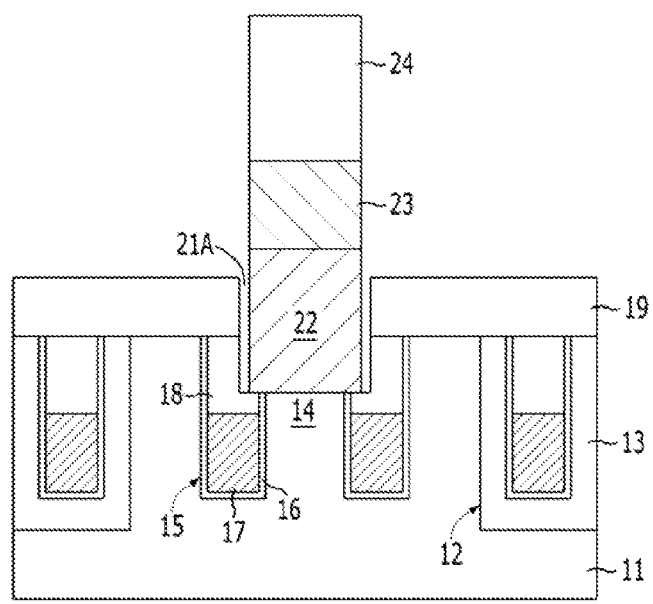

Referring to FIGS. 3D and 4D, bit lines structures are formed. For example, the hard mask layer 24A and the second conductive layer 23A are etched. As a result, bit lines 23 and a bit line hard mask 24 are formed. The bit lines 23 include a tungsten-containing material. The bit lines 23 may include a tungsten layer. The bit line hard mask 24 protects the bit lines 23. The bit line hard mask 24 includes an insulating material. The bit line hard mask 24 may include silicon nitride.

Subsequently, the etch stop layer 20 is etched. The etch stop layer 20 may also be etched to have the same line width as that of the bit lines 23.

Subsequently, first conductive plugs 22 are formed by etching the preliminary first conductive plugs 22A. The preliminary first conductive plugs 22A may be etched to have the same line width as that of the bit lines 23. The first conductive plugs 22 are formed over the recessed active regions 14. In other words, the first conductive plugs 22 are formed inside of the first openings 21. The line width of the first conductive plugs 22 is narrower than the width of the first openings 21. Therefore, gaps 21A are formed between the respective first conductive plugs 22 and the first inter-layer dielectric layers 19. The gaps 21A are not formed around the first conductive plugs 22 in the direction in which the bit lines 23 are extended. In other words, the gaps 21A are formed around the first conductive plugs 22 in the direction crossing the bit lines 23.

As described above, as the first conductive plugs 22 are formed, a portion of each first opening 21 is opened again in the form of a gap 21A. This is because the first conductive plugs 22 are etched to have a narrower line width than the width of the first openings 21.

After the bit line structures and the first conductive plugs 22 are formed, or while the bit line structures and the first conductive plugs 22 are formed, transistors which include planar gate structures and are non-buried gate-type transistors may be formed in the peripheral circuit region. Each of the planar gate structures may include a first electrode, a second electrode, and a gate hard mask layer. The first electrode is formed by etching the first conductive layer (not shown) which is used as the preliminary first conductive plugs, and the second electrode is formed by etching the second conductive layer 23A which is used as the bit lines. The gate hard mask layer is formed by etching the hard mask layer 24A. Although not illustrated in the drawing, after the planar gate structures are formed, a source region and a drain region may be formed in the substrate 11 of the peripheral circuit region. In this way, the non-buried-gate-type transistors, as shown in FIG. 2C, may be formed in the peripheral circuit region.

Figure 4E:
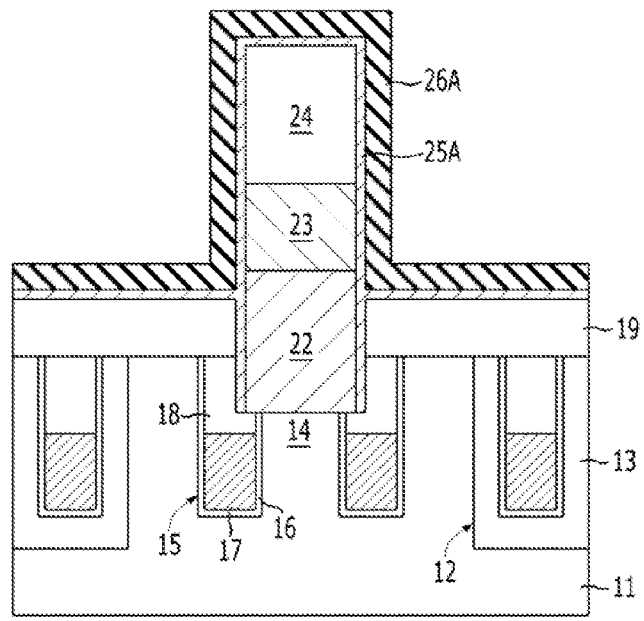

Referring to FIGS. 3E and 4E, a protective spacer layer 25A is formed over the bit line structures. That is, the protective spacer layer 25A is formed over the substrate 11 including the bit line structures. The protective spacer layer 25A includes an insulating material. The protective spacer layer 25A may include silicon oxide or silicon nitride. The protective spacer layer 25A is formed conformally (in a liner pattern) and thus does not entirely fill the gaps 21A. The protective spacer layer 25A protects the bit lines 23 and the first conductive plugs 22 from the subsequent process.

A plug spacer layer 26A is formed over the protective spacer layer 25A. The plug spacer layer 26A includes insulating material. The plug spacer layer 26A and the protective spacer layer 25A may be formed of the same material. The plug spacer layer 26A may include silicon oxide or silicon nitride. The plug spacer layer 26A fills the gaps 21A. In other words, the gaps 21A with a narrow width may be filled with the protective spacer layer 25A.

Figure 4F:
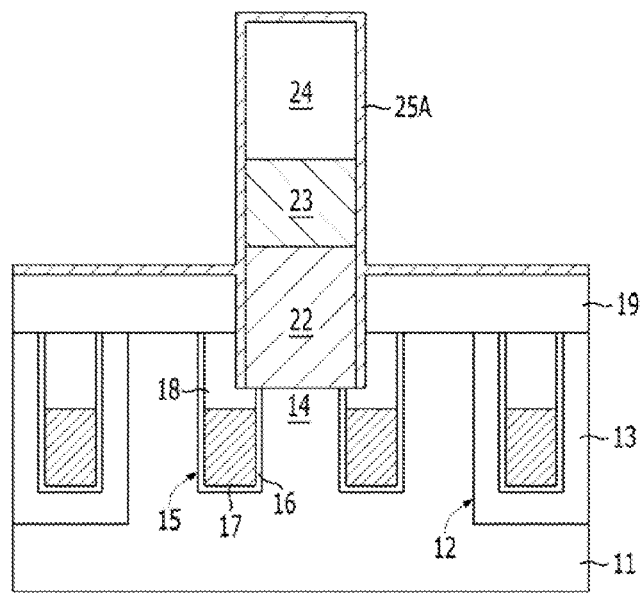

Referring to FIGS. 3F and 4F, the plug spacer layer 26A is removed leaving a portion in the gaps 21A. An etch-back process may be performed to recess the plug spacer layer 26A into the gaps 21A. As a result, insulating plugs 26 may be formed on the sidewalls of each first conductive plug 22 with having the protective spacer layer 25A placed between them. Upper levels of the insulating plugs 26 are controlled to be lower than upper surfaces of the bit line structures. For example, the insulating plugs 26 are formed on the sidewalls of each first conductive plug 22, and the insulating plugs 26 do not extend over the sidewalls of the bit lines 23. The plug spacer layer 26A placed over the upper surface of the first inter-layer dielectric layer 19 is removed. The insulating plugs 26 are in the form of pillars which are filling the gaps 21A. The insulating plugs 26 prevent the gaps 21A from being filled with a multi-layer spacer layer in the subsequent process. In short, the insulating plugs 26 prevent air gaps from being formed on the sidewalls of the first conductive plugs 22. Also, the open area between the bit line structures may be widened by removing the plug spacer layer 26A from the sidewalls of the bit lines 23. As a result, the open area of second openings, which are to be formed later, is secured.

Figure 4G:
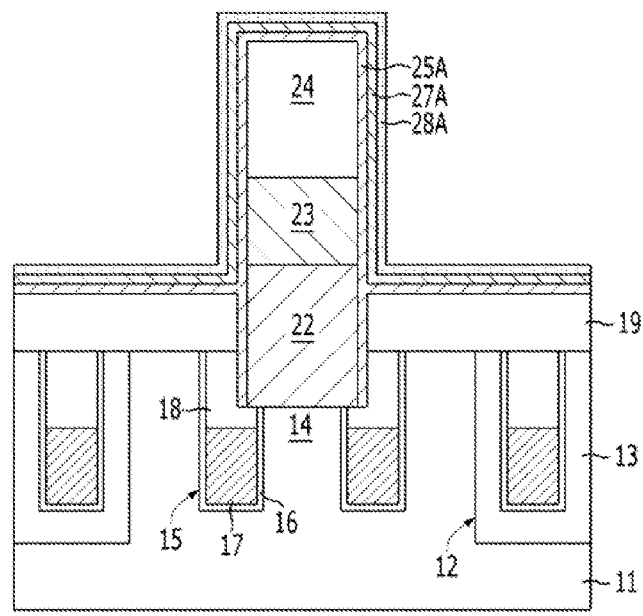

Referring to FIGS. 3G and 4G, a first spacer layer 27A is formed over the insulating plugs 26. The first spacer layer 27A is formed conformally (i.e., in liner patterns) over the substrate including the insulating plugs 26. The first spacer layer 27A includes insulating material. The first spacer layer 27A may include silicon oxide or silicon nitride. The first spacer layer 27A protects upper portions of the insulating plugs 26. The protective spacer layer 25A and the insulating plugs 26 are placed over the first conductive plugs 22. The protective spacer layer 25A and the first spacer layer 27A are disposed over the bit lines 23.

A sacrificial spacer layer 28A is formed over the first spacer layer 27A. That is, the sacrificial spacer layer 28A is formed over the substrate including the first spacer layer 27A. The sacrificial spacer layer 28A includes insulating material. The sacrificial spacer layer 28A may include silicon oxide or silicon nitride. The sacrificial spacer layer 28A may be formed of material that is different from that of the first spacer layer 27A. When the sacrificial spacer layer 28A is removed, the first spacer layer 27A serves as an etch barrier.

Figure 4H:
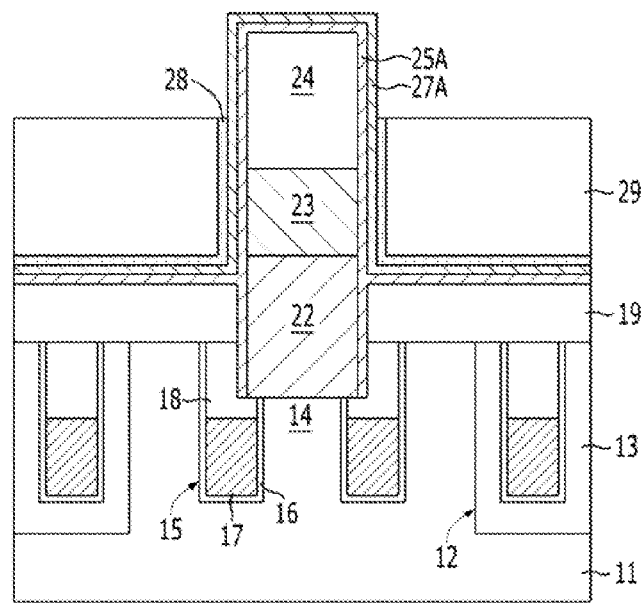

Referring to FIGS. 3H and 4H, a protective layer 29 is formed. The protective layer 29 may include material that may serve as an etch barrier during the etch process of the sacrificial spacer layer 28A and the first spacer layer 27A. The protective layer 29 may include carbon-containing material. The protective layer 29 may include a carbon layer formed through a Spin-On-Coating process.

Subsequently, the protective layer 29 is recessed. An etch-back process may be performed to recess the protective layer 29. The protective layer 29 may be recessed so that an upper layer of the protective layer 29 is placed at a higher level than upper surfaces of the bit lines 23.

The sacrificial spacer layer 28A is recessed. As a result, sacrificial spacers 28 are formed. An etch-back process may be performed to recess the sacrificial spacer layer 28A. The sacrificial spacers 28 may remain over the sidewalls of the bit lines 23 and extend over the sidewalls of the bit line hard mask 24. Upper surfaces of the sacrificial spacers 28 and an upper surface of the protective layer 29 may come on the same plane. While the etch-back process is performed to form the sacrificial spacers 28, the first spacer layer 27A may remain intact.

Figure 4I:
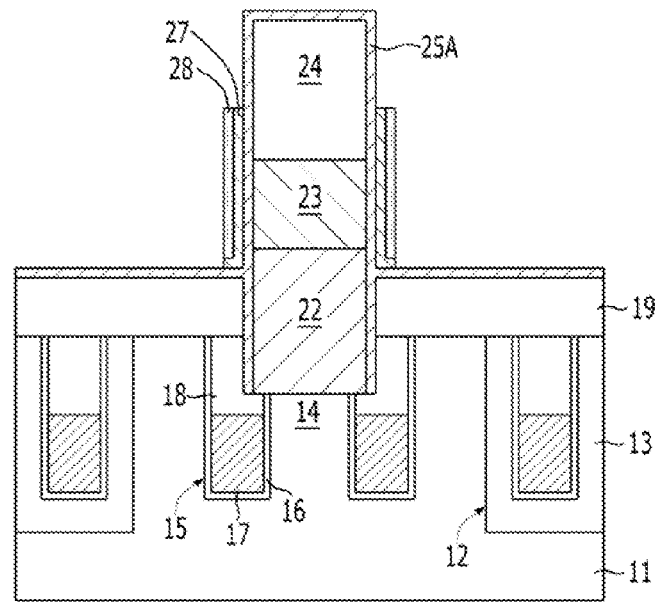

Referring to FIGS. 3I and 4I, the protective layer 29 is removed. The protective layer 29 may be removed through a dry etch process or a wet etch process.

The first spacer layer 27A is recessed. As a result, first spacers 27 are formed. An etch-back process may be performed to recess the first spacer layer 27A. If the etch-back process is performed to form the first spacers 27, the sacrificial spacers 28 are not subject to the etch-back and may remain intact.

Figure 4J:
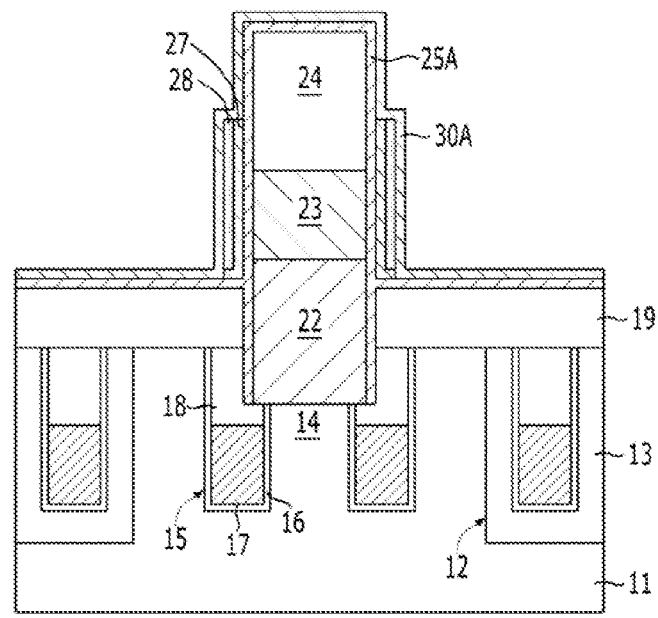

Referring to FIGS. 3J and 4J, a second spacer layer 30A is formed. The second spacer layer 30A seals the sacrificial spacers 28. The second spacer layer 30A protects the sacrificial spacers 28 from being attacked. As a result, air gaps may be formed to have a uniform height.

The second spacer layer 30A includes insulating material. The second spacer layer 30A may include silicon oxide or silicon nitride. The second spacer layer 30A protects the sacrificial spacers 28 from the exterior.

As described above, upon formation of the second spacer layer 30A, the multi-layer spacer layer is completed. The multi-layer spacer layer includes the protective spacer layer 25A, the first spacers 27, the sacrificial spacers 28, and the second spacer layer 30A.

Figure 4K:
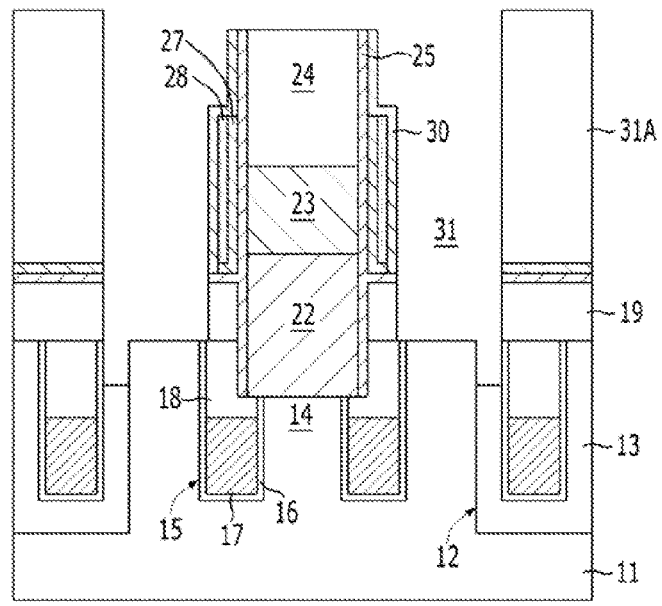

Referring to FIGS. 3K and 4K, second openings 31 are formed. The second openings 31 are formed in a second inter-layer dielectric layer 31A. In order to form the second openings 31, an etch process may be performed after the second inter-layer dielectric layer 31A is deposited. The second inter-layer dielectric layer 31A includes an insulating material. The second inter-layer dielectric layer 31A may include silicon oxide or silicon nitride. The second openings 31 may have a form of contact holes. The second openings 31 may be formed in an area defined by two neighboring bit line structures.

Subsequently, the lower portions of the second openings 31 extend downward. For example, the surface of the substrate 11 under the second openings 31 is exposed. First, the second spacer layer 30A is etched to form second spacers 30. The first spacers 27, the protective spacer layer 25A and the first inter-layer dielectric layer 19 are partially etched to be aligned to the second spacers 30.

As described above, the second openings 31 are formed on both sides of the bit line structures. Multi-layer spacer structures are formed on the sidewalls of the bit line structures. First spacer structures including protective spacers 25 and the insulating plugs 26 are formed on the sidewalls of the first conductive plugs 22. Second spacer structures including the protective spacers 25, the first spacers 27, the sacrificial spacers 28, and the second spacers 30 are formed on the sidewalls of the bit lines 23. The protective spacers 25 may be extended over the sidewalls of the bit lines 23 from over sidewalls of the first conductive plugs 22.

The protective spacers 25, the insulating plugs 26, the first spacers 27, and the second spacers 30 each may include silicon nitride, and the sacrificial spacers 28 may include a silicon oxide. As a result, the second spacer structures having an 'N—N—O—N' structure are formed on the sidewalls of the bit lines 23, and the first spacer structures having an 'N—N' structure are formed on the sidewalls of the first conductive plugs 22.

Figure 4L:
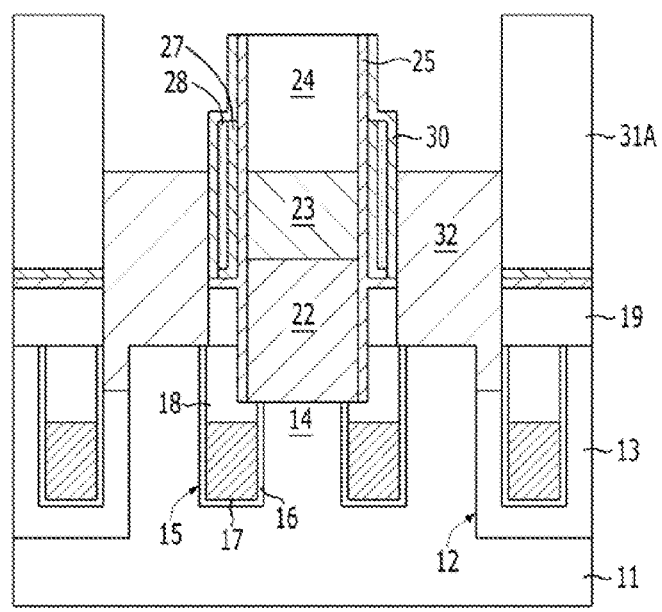

Referring to FIGS. 3L and 4L, second conductive plugs 32 are formed. The second conductive plugs 32 are formed to be recessed in the second openings 31. Specifically, a third conductive layer (not shown) is formed over the second inter-layer dielectric layer 31A and fills the second openings 31. The second conductive plugs 32 are formed inside of the second openings 31 by selectively removing the third conductive layer (not shown). An etch-back process may be performed on the third conductive layer (not shown) to form the second conductive plugs 32. The second conductive plugs 32 may include a silicon-containing layer. Each of the second conductive plugs 32 may include a polysilicon layer. The polysilicon layer may be doped with an impurity through a doping process, such as an implantation process. The second conductive plugs 32 contact the surface of the substrate 11. The second conductive plugs 32 are recessed so that upper surfaces of the second conductive plugs 32 are located lower than upper surfaces of the bit line structures and the second inter-layer dielectric layer 31A. The upper surfaces of the second conductive plugs 32 may be controlled to be at a level as low as possible. This is to minimize the volume occupied by the second conductive plugs 32 in the conductive structures formed in the second openings 31. In this way, resistance may be reduced.

Figure 4M:
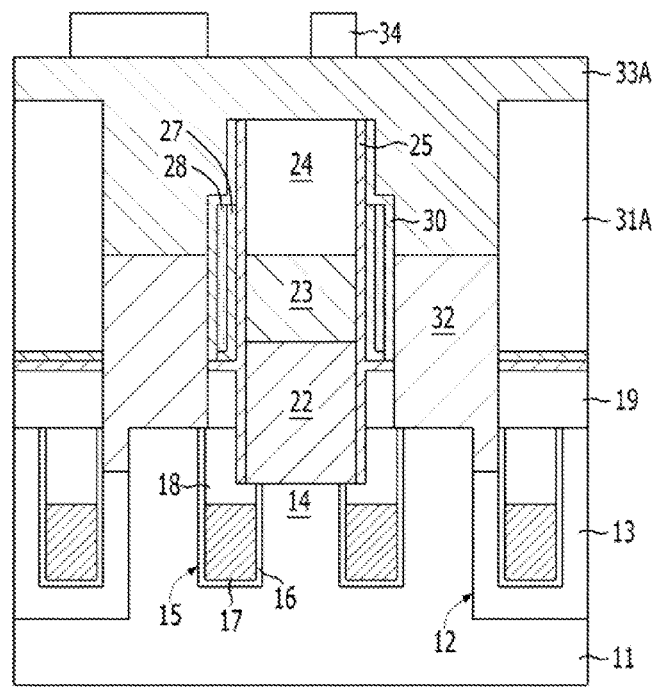

Referring to FIGS. 3M and 4M, a fourth conductive layer 33A is formed over the second conductive plugs 32 and over the bit line structures. The fourth conductive layer 33A is formed over the second conductive plugs 32 in the manner such that it fills the remaining portions of the second openings 31. The fourth conductive layer 33A may include a metal-containing layer. The fourth conductive layer 33A may include tungsten-containing material. The fourth conductive layer 33A may include a tungsten layer or a tungsten compound layer.

Subsequently, a mask layer 34 is formed over the fourth conductive layer 33A. The mask layer 34 may be patterned in a form of overlapping with the upper portions of the bit line structures by a predetermined area.

Figure 4N:
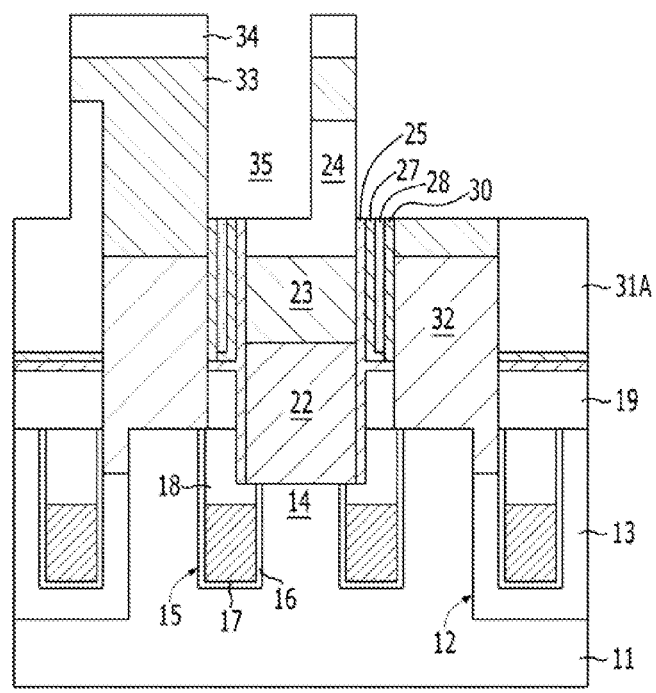

Referring to FIGS. 3N and 4N, third conductive plugs 33 are formed. The third conductive plugs 33 are formed by etching the fourth conductive layer 33A. For example, the fourth conductive layer 33A is etched by using the mask layer 34 as an etch barrier.

The third conductive plugs 33 partially overlap with the bit line structures and the second conductive plugs 32 and are coupled to the second conductive plugs 32. Upon forming of the third conductive plugs 33, the multi-layer spacer may be exposed. That is, the protective spacers 25, the first spacers 27, the sacrificial spacers 28, and the second spacers 30 may be exposed.

After the third conductive plugs 33 are formed, the protective spacers 25, the first spacers 27, the sacrificial spacers 28, and the second spacers 30 are etched using the third conductive plug 33 as etch barrier. Also, a portion of the second inter-layer dielectric layer 31A and a portion of the bit line hard mask 24 are etched to a predetermined depth. As a result, recesses 35 are formed. As show in the top view in FIG. 1A, at least a portion of each second conductive plug 32 is covered by the third conductive plug 33, and the other portion of each second conductive plug 32 is exposed by the recess 35. The recesses 35 are controlled to have a depth that is deep enough to expose the upper portions of the sacrificial spacers 28.

Figure 4O:
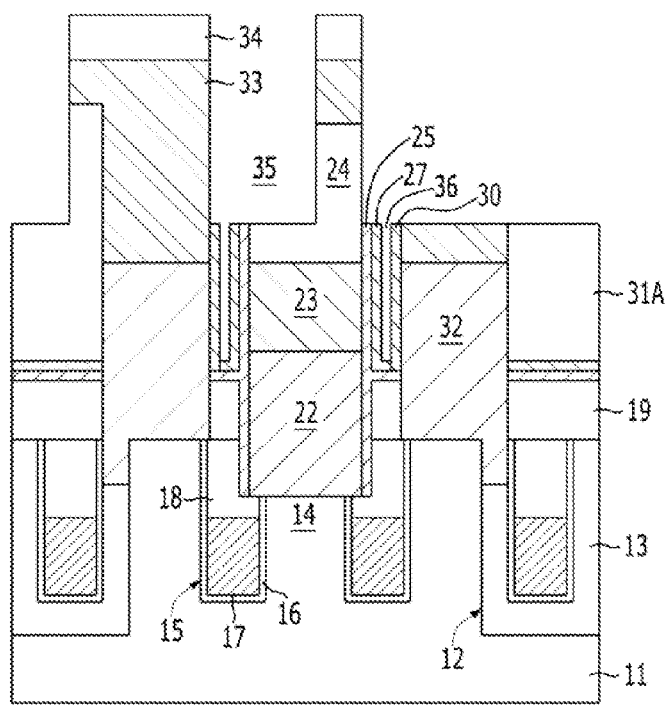
Figure 4P:
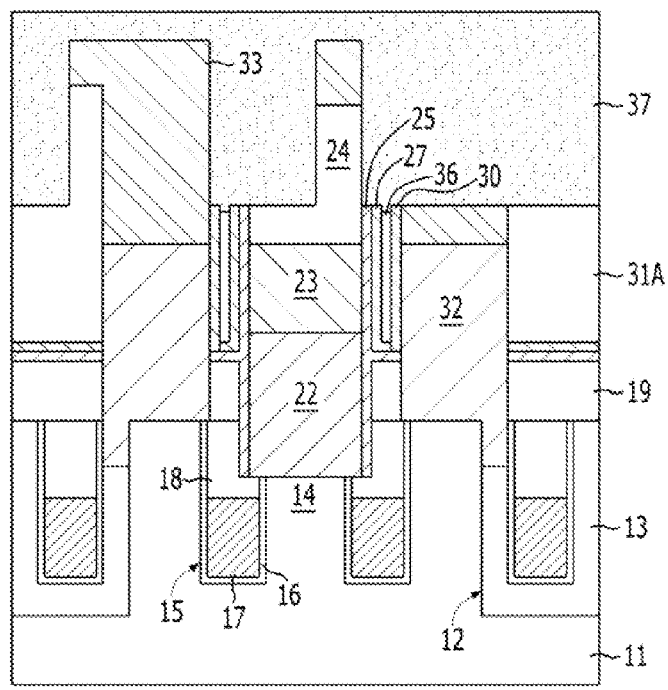
Figure 4Q:
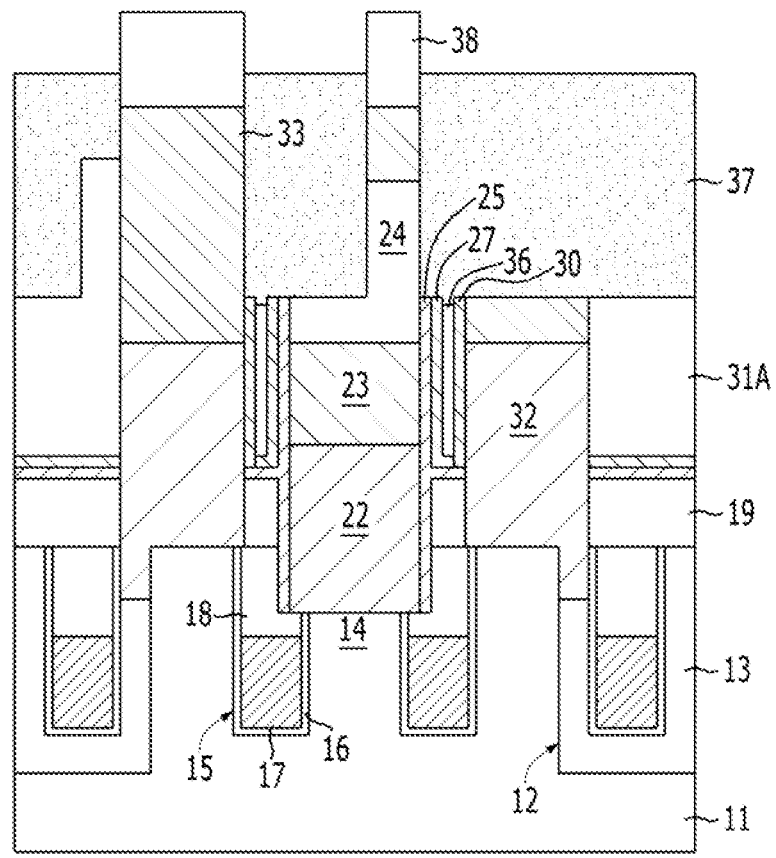

Referring to FIGS. 3O and 4O, the mask layer 34 is removed. Subsequently, the sacrificial spacers 28 are removed. As a result, air gaps 36 are formed. That is, the areas occupied by the sacrificial spacer 28 are left as the air gaps 36. A stripping process is performed to remove the sacrificial spacers 28. The stripping process includes a cleaning process. The cleaning process is performed using a wet chemical capable of removing the sacrificial spacers 28. The wet chemical flows into the lower portions of the third conductive plugs 33 to easily remove the sacrificial spacers 28 under the third conductive plugs 33. The stripping process may include a cleaning process and may be performed after the third conductive plugs 33 are etched.

The sacrificial spacers 28 are removed through the stripping process, and the space occupied by the sacrificial spacers 28 remains as the air gaps 36. The air gaps 36 may be formed in parallel to the sidewalls of the bit lines 23. This is called 'line-type air gaps 36.'

As described above, the line-type air gaps 36 are formed over sidewalls of the bit lines 23. As a result, air gap spacer structures including the protective spacers 25, the first spacers 27, the line-type air gaps 36, and the second spacers 30 are formed between the bit lines 23 and the second conductive plugs 32. Since the protective spacers 25, the first spacers 27, and the second spacers 30 each may include silicon nitride, the air gap spacer structures may have 'N—N-Air-N' structures.

Since there is no spacer structure surrounding the sidewalls of the second conductive plugs 32, the space where the second conductive plugs 32 are to be formed may be secured sufficiently. In short, a margin for forming the second openings 31 may increase.

Some portion of the line-type air gaps 36 are exposed, but some portion of each line-type air gap 36 may be capped by the third conductive plug 33.

Referring to FIG. 3P a capping layer 37 is formed. The capping layer 37 may include insulating material. The capping layer 37 may include material having poor step coverage. For example, the capping layer 37 may be formed through a Plasma Chemical Vapor Deposition (PECVD) process, and as a result, the line-type air gaps 36 remain empty, rather than being filled with the capping layer 37. The capping layer 37 may include silicon oxide or silicon nitride. The capping layer 37 may include silicon nitride formed through the PECVD process. The capping layer 37 caps (i.e., are formed over) the line-type air gaps 36 and gap-fills the recesses 35. Also, the capping layer 37 caps upper portions of the third conductive plugs 33.

As described above, a portion of each line-type air gap 36 is capped by a third conductive plug 33 and another portion of the line-type air gap 36 is capped by the capping layer 37.

The first conductive plugs 22 may be simply referred to as bit line contact plugs. The second conductive plugs 32 and the third conductive plugs 33 may be collectively referred to as storage node contact plugs. According to an embodiment, the line-type air gaps 36 are formed between the bit lines 23 and the storage node contact plugs.

Referring to FIGS. 3Q and 4Q, memory elements 38 that are electrically coupled with the third conductive plugs 33 may be formed over the third conductive plugs 33.

According to an embodiment, the formation of the line-type air gaps 36 improves the electrical insulation characteristics between the bit lines 23 and the storage node contact plugs. For example, it decreases the parasitic capacitance between the bit lines 23 and the storage node contact plugs.

Also, since the third conductive plugs 33, which may include metal-containing material, the contact resistance of the storage node contact plugs may be improved.

According to an embodiment, the formation of the line-type air gaps 36 between the storage node contact plugs and the bit lines 23 reduces the parasitic capacitance. The reduced parasitic capacitance may improve a sensing margin.

In addition, since no spacer is necessary to be formed over a sidewall of the second conductive plugs 32, the second conductive plugs 32 may be formed wider. Thus, the contact resistance between the second conductive plugs 32 and the third conductive plugs 33 may be reduced and, as a result, the Write Recovery Time tWR is improved. Accordingly, the operation rate of the memory cells can be improved.

The semiconductor device in accordance with an embodiment may be applied to Dynamic Random Access Memory (DRAM) but is not limited thereto. For example, it may also be applied to other memories, such as Static Random Access Memory (SRAM), flash memory, Ferroelectric Random Access Memory (FeRAM), Magnetic Random Access Memory (MRAM), Phase-Change Random Access Memory (PRAM) and the like.

Figure 5:
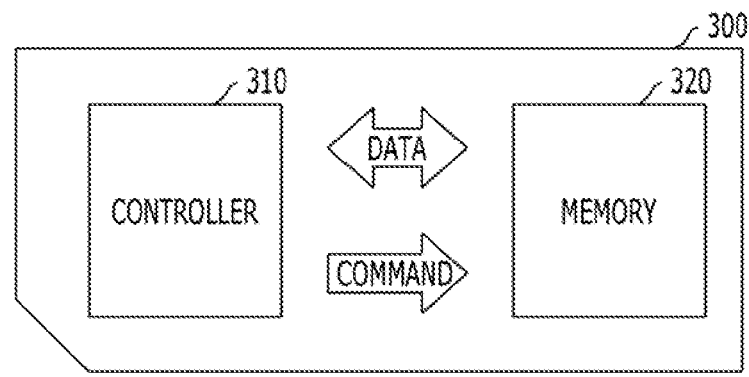
FIG. 5 illustrates a memory card.

FIG. 5 illustrates a memory card.

Referring to FIG. 5, the memory card 300 may include a controller 310 and a memory 320. The controller 310 and the memory 320 may exchange electrical signals with each other. For example, the controller 310 and the memory 320 may exchange data with each other upon receipt of a command of the controller 310. In this way, the memory card 300 may store the data in the memory 320 or output the data to the exterior. The memory 320 may include a semiconductor device including the line-type air gaps described above. The memory card 300 may be used as a data storage medium for diverse portable devices.

Figure 6:
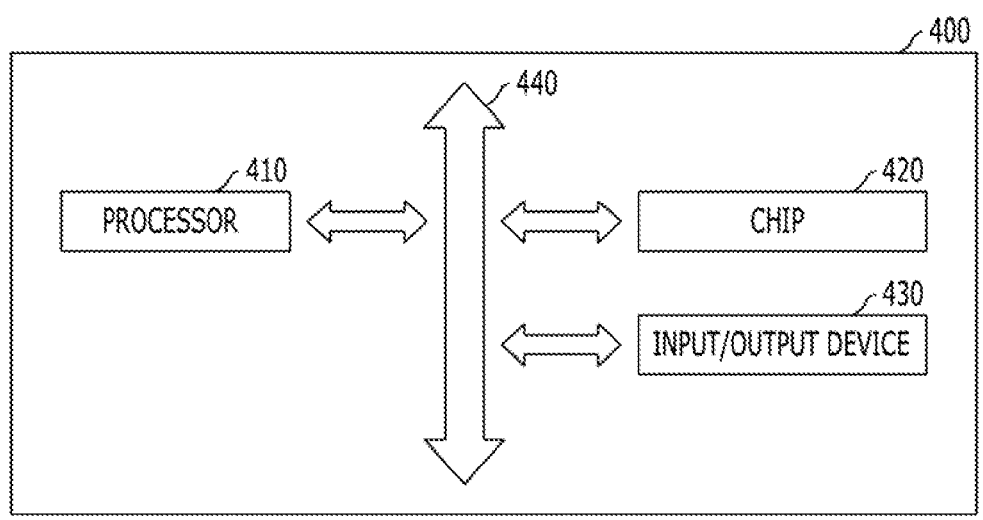
FIG. 6 is a block diagram showing an electronic system.

FIG. 6 is a block diagram showing an electronic system.

Referring to FIG. 6, the electronic system 400 may include a processor 410, an input/output device 430, and a chip 420. The processor 410, the input/output device 430, and the chip 420 may communicate data with each other through buses 440. The processor 410 executes a program, and the electronic system 400 performs a control. The input/output device 430 is used to input or output data to/from the electronic system 400. The electronic system 400 may be connected to an external device, such as a personal computer or a network, and exchange data with the external device by using the input/output device 430. The chip 420 may store codes and data for the operation of the processor 410, and process some of the operations given by the processor 410. For example, the chip 420 may include a semiconductor device including the air gaps that are described above. The electronic system 400 may form diverse electronic control devices using the chip 420.

According to an embodiment, parasitic capacitance between bit lines and storage node contact plugs may be decreased by forming line-type air gaps on the sidewalls of the bit lines.

According to an embodiment, the resistance of the storage node contact plugs may be decreased since no spacer is necessary to be formed over sidewalls of the storage node contact plugs. Instead, line-type air gaps formed over the sidewalls of the bit lines may effectively insulate the storage node contact plugs from the bit lines.

The line-type air gaps are capped with plugs and a capping layer, and thus the line-type air gaps may be stably protected during a subsequent process.

Stable capping of the line-type air gaps may further decrease parasitic capacitance and contact resistance.

What is claimed is:

1. A method for fabricating a semiconductor device, comprising:
   forming a first inter-layer dielectric layer over a substrate;
   forming a first contact hole by etching the first inter-layer dielectric layer;
   forming a preliminary first conductive plug that fills the first contact hole;
   forming a bit line structure including a bit line over the preliminary first conductive plug;
   forming a first conductive plug and a gap by etching the preliminary first conductive plug so that the gap is formed inside of the first contact hole and between a sidewall of the first contact hole and the first conductive plug;

forming an insulating plug in the gap;

forming a multi-layer spacer including a sacrificial spacer and extending from over an upper portion of the insulating plug to over a sidewall of the bit line structure;

forming a second conductive plug neighboring the bit line structures and the first conductive plugs with the multi-layer spacer and the insulating plug therebetween; and forming a line-type air gap within the multi-layer spacer by removing the sacrificial spacer.

2. The method of claim 1, wherein the forming of the insulating plug includes:

forming a protective spacer in a liner pattern over the gap and over the bit line structure;

forming a plug spacer layer filling the gaps over the protective spacer; and forming the insulating plug by patterning the plug spacer layer so that the plug spacer layer is recessed in the gap.

3. The method of claim 2, wherein the protective spacer and the insulating plug respectively include silicon nitride.

4. The method of claim 1, wherein the forming of the second conductive plug includes:

forming a second inter-layer dielectric layer over the multi-layer spacer located between the bit line structure and a neighboring bit line structure;

forming a second contact hole by patterning the second inter-layer dielectric layer;

extending the second contact hole to expose a surface of the substrate;

forming a conductive layer that fills the second contact hole; and forming the second conductive plug by recessing the conductive layer.

5. The method of claim 1, wherein the forming of the line-type air gap includes:

forming a third conductive plug over the multi-layer spacer and over the second conductive plug;

exposing the sacrificial spacer by partially etching the multi-layer spacer using the third conductive plug as etch barrier; and removing the sacrificial spacer to form the line-type air gap.

6. The method of claim 5, wherein the forming of the multi-layer spacer includes:

forming a first spacer layer over the substrate including the insulating plug and over the bit line structure;

forming a sacrificial spacer layer over the first spacer layer;

patterning the sacrificial spacer layer and the first spacer layer to form the sacrificial spacer and a first spacer; and forming a second spacer layer that seals the sacrificial spacer and the first spacer.

7. The method of claim 6, wherein the first spacer layer and the second spacer layer each include silicon nitride, and the sacrificial spacer layer includes silicon oxide.

8. The method of claim 5, wherein the first conductive plug and the second conductive plug each include polysilicon, and the third conductive plug includes metal material.

9. The method of claim 5, further comprising:

forming a capping layer that caps the line-type air gap, after the forming of the line-type air gap; and forming a memory element coupled with the third conductive plug and extending through the capping layer.

10. The method of claim 1, further comprising:

forming a buried word line in the substrate, before the forming of the first inter-layer dielectric layer.

11. The method of claim 1, further comprising:

forming a planar gate structure in a peripheral circuit region of the substrate, wherein the planar gate structure is formed at substantially the same time as when the first conductive plug and the bit line structure are formed.

12. The method of claim 1, wherein the first conductive plug and the bitline have the same line width.

13. The method of claim 12, wherein the insulating plug surrounds partially the first conductive plug.

14. The method of claim 12, wherein the multi-layer spacer completely surrounds the line-type air gap.

15. The method of claim 1, wherein the forming of the multi-layer spacer includes:

forming a first spacer layer over the substrate including the insulating plug and over the bit line structure;

forming a sacrificial spacer layer over the first spacer layer;

forming a protective layer over the sacrificial spacer;

recessing the protective layer;

recessing the sacrificial spacer layer to form a sacrificial spacer;

removing the recessed protective layer;

recessing the first spacer layer to form a first spacer; and forming a second spacer layer that seals the sacrificial spacer and the first spacer.

16. The method of claim 12, wherein the protective layer including carbon-containing material.

* * * * *